(12) United States Patent
Messi Bene Eloundou et al.

(10) Patent No.: US 11,264,894 B2
(45) Date of Patent: Mar. 1, 2022

(54) CONVERTER AND CURRENT CONTROL SYSTEM THEREOF

(71) Applicant: Valeo Siemens eAutomotive France SAS, Cergy (FR)

(72) Inventors: Norbert Messi Bene Eloundou, Belfort (FR); Singaravelu Mani, Channai (IN)

(73) Assignee: Valeo Siemens eAutomotive France SAS, Cergy (FR)

( * ) Notice: Subject to any disclaimer, the term of this patent is extended or adjusted under 35 U.S.C. 154(b) by 0 days.

(21) Appl. No.: 16/892,134

(22) Filed: Jun. 3, 2020

(65) Prior Publication Data
US 2020/0389086 A1 Dec. 10, 2020

(30) Foreign Application Priority Data
Jun. 7, 2019 (FR) ...................................... 1906070

(51) Int. Cl.
*H02M 1/42* (2007.01)
*H02M 7/155* (2006.01)
*H02M 1/00* (2006.01)
*H02M 3/158* (2006.01)

(52) U.S. Cl.
CPC ....... *H02M 1/4208* (2013.01); *H02M 1/4225* (2013.01); *H02M 1/4233* (2013.01); *H02M 7/155* (2013.01); *H02M 1/0043* (2021.05); *H02M 1/0083* (2021.05); *H02M 1/0085* (2021.05); *H02M 3/1586* (2021.05)

(58) Field of Classification Search
CPC .... H02M 7/155; H02M 1/4208; H02M 1/088; H02M 1/092; H02M 1/0085; H02M 1/0043; H02M 1/42; H02M 1/0083; H02M 1/0092
See application file for complete search history.

(56) References Cited

U.S. PATENT DOCUMENTS 6,009,008 A * 12/1999 Pelly ..................... H02H 7/125
363/125
2017/0294833 A1* 10/2017 Yang ................... H01F 27/2804
(Continued)

FOREIGN PATENT DOCUMENTS

EP 2871760 A1 5/2015
EP 3109988 A1 12/2016

OTHER PUBLICATIONS

Search Report from French Intellectual Property Office on corresponding FR application (FR1906070) dated Feb. 7, 2020.
(Continued)

*Primary Examiner* — Gary L Laxton
(74) *Attorney, Agent, or Firm* — Klein, O'Neill & Singh, LLP

(57) ABSTRACT

A converter configured to supply an energy consuming element during an operating phase and may charge a capacitor during a pre-charging phase prior to the operating phase. The converter may have a power factor correction circuit having the capacitor and thyristors. The converter may also have a control system configured to control the pre-charging phase. The control system may have a control unit configured to, during the operating phase, detect the state of charge of the capacitor, and generate a control signal configured to control the thyristors as a function of the state of charge of the capacitor.

8 Claims, 4 Drawing Sheets

(56) References Cited

U.S. PATENT DOCUMENTS

2019/0006959 A1* 1/2019 Benabdelaziz ....... H02M 7/757
2019/0006960 A1* 1/2019 Benabdelaziz ......... H02M 1/08

OTHER PUBLICATIONS

Malik, Ayan et al., "Minimum Inrush Start-up Control of a Single-Phase Interleaved Totem-Pole PFC Rectifier", 2018 IEEE Applied Power Electronics Conference and Exposition (APEC), IEEE, Mar. 4, 2018, pp. 754-759, XP033347331, DOI: 10.1109/APEC.2018.8341096.

* cited by examiner

CONVERTER AND CURRENT CONTROL SYSTEM THEREOF

TECHNICAL FIELD

The present invention relates to, generally speaking, a converter, in particular for an electric charger of an electric vehicle.

The invention more particularly pertains to a converter and the control system thereof.

BACKGROUND

In a known manner, an electric charger of an electric vehicle (EV) or hybrid vehicle comprises a converter comprising a power factor correction (PFC) circuit. Several topologies of PFC circuits implemented in converters exist, in particular for vehicle electric chargers.

Among these known topologies, the interleaved totem pole bridgeless PFC circuit is considered as an attractive PFC topology compared to other known PFC topologies because it enables a converter not only to comprise fewer electronic components, but also to exhibit fewer losses. Said interleaved totem pole bridgeless PFC circuit is often associated with a DC-link capacitor. Before carrying out a transfer of energy for supplying an energy consuming element, the DC-link capacitor needs to be charged beforehand, in order to avoid an inrush current during operation of the converter. Two switching circuits 2a and 2b, known for their applications for pre-charging a capacitor, are respectively described in FIGS. 1 and 2.

FIG. 1 illustrates a topology of PFC circuit used for a converter 1a connected to an alternating voltage source V1 and to an energy consuming element M1. The converter 1a comprises a PFC circuit and a switching circuit 2a. The switching circuit 2a is configured to control a current circulating between the alternating voltage source V1 and the converter 1a, either during a pre-charging phase during which a capacitor C1 of the converter 1a is charged, or during an operating phase during which the energy consuming element M1 consumes electrical energy supplied by the alternating voltage source V1.

Said PFC circuit is an interleaved totem pole bridgeless PFC circuit comprising a plurality of switches Q1 to Q4, at least a diode D5 and D6, a transformer, and the capacitor C1. The switches Q1 to Q4 are MOSFETs (Metal Oxide Semiconductor Field Effect Transistors). The switches Q1 and Q2 are connected in series and thus form a first arm. The switches Q3 and Q4 are connected in series and form a second arm. The transformer comprises two inductances L1 and L2 of which each comprises, as illustrated in FIG. 1, a terminal connected to a node J1 or J2 corresponding to a mid-point of said first arm or said second arm.

The diodes D5 and D6 are respectively connected to the capacitor C1, to the switches Q1 to Q4 and to the alternating voltage source V1. The diodes D5 and D6, connected in series, are configured to form rectifiers which make it possible to transform the alternating current generated by the alternating voltage source V1 into unidirectional current. The diodes D5 and D6 are conventional diodes or those made of silicon carbide (SiC). In addition, a node J3 corresponding to a connection point between the two diodes D5 and D6, is connected to a negative terminal of the alternating voltage source V1.

The circuit in series composed of the diodes D5 and D6, said first arm, said second arm, the capacitor C1 and the energy consuming element M1 are connected in parallel.

The switching circuit 2a, connected to the alternating voltage source V1 and to said PFC circuit, comprises a transfer relay S1 and a pre-charging circuit. The pre-charging circuit comprises a pre-charging relay S2 and a limiting resistor RL which are connected in series. The limiting resistor RL may be replaced by a thermistor. Said pre-charging circuit is connected in parallel with the transfer relay S1. The transfer relay S1 and the pre-charging relay S2 are alternating current relays. The limiting resistor RL may be replaced by a thermistor.

During a pre-charging phase of the converter 1a, the pre-charging relay S2 is closed whereas the transfer relay S1 is open. The pre-charging relay S2 is configured to disconnect the limiting resistor RL once the pre-charging of the capacitor C1 is finished. During an operating phase of the converter 1a, the transfer relay S1 is closed whereas the pre-charging relay S2 is open. The transfer relay S1 of the switching circuit 2a is then configured to allow or to cut the current transferred between the constant current source V1 and the converter 1a.

FIG. 2 illustrates another configuration of a switching circuit 2b comprised in a converter 1b. The switching circuit 2b also comprises a transfer relay S1 and a pre-charging circuit. The only difference between the two circuits illustrated in FIGS. 1 and 2 resides in the configuration of the switching circuit 2b. The pre-charging circuit of the switching circuit 2b comprises a pre-charging relay S2 and a limiting resistor RL which are connected in parallel. In the switching circuit 2b, the pre-charging circuit and the transfer relay S1 are connected in series. In FIG. 2, during a pre-charging phase of the converter 1b, the pre-charging relay S2 is open and the transfer relay S1 is closed. The pre-charging relay S2 is configured to short-circuit the limiting resistor RL once the pre-charging of the capacitor C1 is finished. During an operating phase of the converter 1b, the transfer relay S1 remains closed as well as the pre-charging relay S2. The transfer relay S1 of the switching circuit 2b is then configured to allow or to cut the current transferred between the constant current source V1 and the converter 1a.

However, alternating current relays S1 and S2 for automobile applications are rare, and the switching circuit 2a or 2b comprising in particular the limiting resistor RL is expensive.

To overcome the aforesaid drawbacks, the present invention targets a less costly solution which makes it possible to carry out pre-charging of the capacitor without use of the typical switching circuit as described previously.

SUMMARY

To achieve this result, the present invention relates to a converter configured to supply an energy consuming element during an operating phase, as well as to charge said capacitor during a pre-charging phase prior to the operating phase. Said converter comprises a PFC (power factor correction) circuit comprising said capacitor and thyristors. Said converter further comprises a control system configured to control said pre-charging phase. Said control system comprises a control unit configured to, during said prior pre-charging phase, detect the state of charge of the capacitor, as well as to generate a control signal configured to control said thyristors as a function of the state of charge of the capacitor.

The invention thus makes it possible to carry out pre-charging of the capacitor without using the typical switching circuit as described previously.

The operating phase is in particular a phase of supplying the energy consuming element through said converter.

Advantageously, if the control unit is configured such that the control signal comprises gate pulses to be applied to said thyristors in such a way that the two thyristors are alternately placed in the conducting state to enable pre-charging of the capacitor.

In an advantageous manner, the gate pulses are in particular of variable durations. These gate pulse durations are in particular determined at least as a function of the state of charge of the capacitor.

In an advantageous manner, the PFC circuit is configured such that, in operating phase, said thyristors operate as diodes.

In a preferential manner, the control unit is configured to, in operating phase, generate a control signal comprising a first gate signal and a second gate signal respectively configured to control the first thyristor and the second thyristor, the two gate signals each being at a high level. In particular, the gate signals are each at a high level throughout the operating phase.

Preferentially, the control unit is configured to, in operating phase, generate a control signal comprising a first gate signal and a second gate signal respectively configured to control the first thyristor and the second thyristor, and at each zero crossing of a supply voltage, that only one of the gate signals comprises a pulse at a high level, such that said thyristors are alternately controlled on detection of zero crossing.

Advantageously, said control system comprises starting circuits, respectively dedicated to one of said thyristors and respectively configured to control, as a function of said control signal, the thyristor to which the starting circuit is dedicated.

In an advantageous manner, said starting circuits each comprise a signal adaptation component configured to control through galvanic isolation.

In a preferential manner, said starting circuits each comprise at least a resistor and a diode, wherein the diode of one of said starting circuits is connected to a node corresponding to a connection point between the capacitor and the thyristor to which the starting circuit is dedicated; the diode of the other of said starting circuits being connected to a node corresponding to a connection point between the thyristors connected in series.

Preferentially, said PFC circuit comprises a first arm comprising two switches, a second arm comprising two switches; said first arm, said second arm, a third arm comprising said thyristors, the capacitor, and the energy consuming element being connected between two nodes.

Advantageously, the PFC circuit is an interleaved totem pole bridgeless PFC circuit; the capacitor being a DC-link capacitor.

Advantageously, the switches of the PFC circuit are metal oxide semiconductor field effect transistors (MOSFETs) or isolated gate bipolar transistors (IGBTs).

BRIEF DESCRIPTION OF THE DRAWINGS

Other characteristics and advantages of the invention will become clear on reading the description that follows. This is purely illustrative and should be read with regard to the appended figures among which.

It should be noted that the figures set out the invention in a detailed manner for implementing the invention, said figures obviously being able to better define the invention if need be.

DETAILED DESCRIPTION

Figure 1:
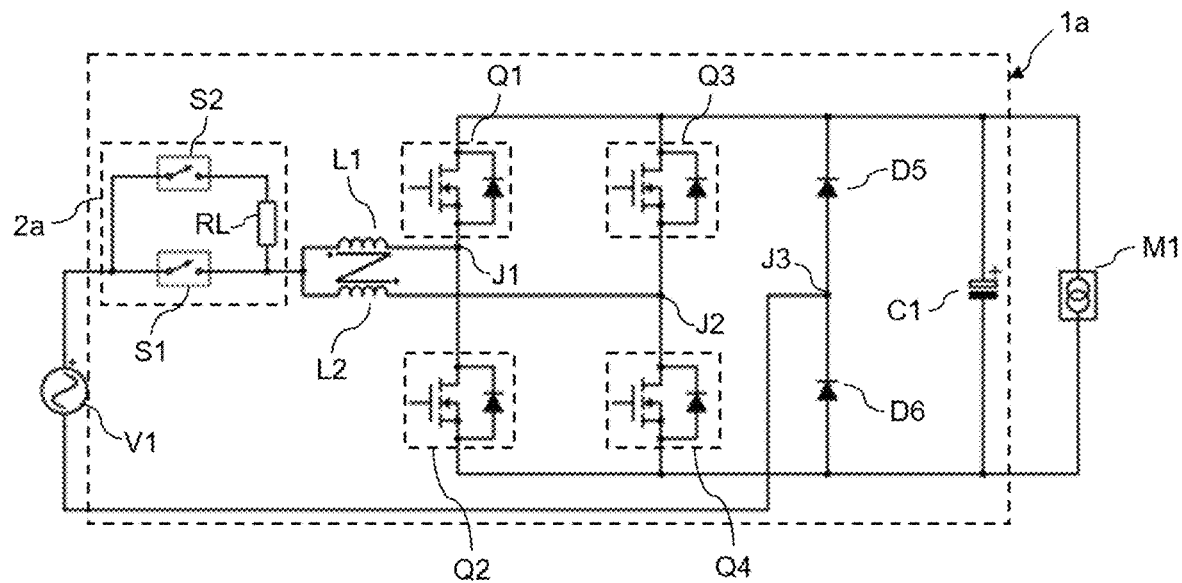
FIG. 1 illustrates a topology of a conventional PFC circuit and switching circuit used to form a converter.
Figure 2:
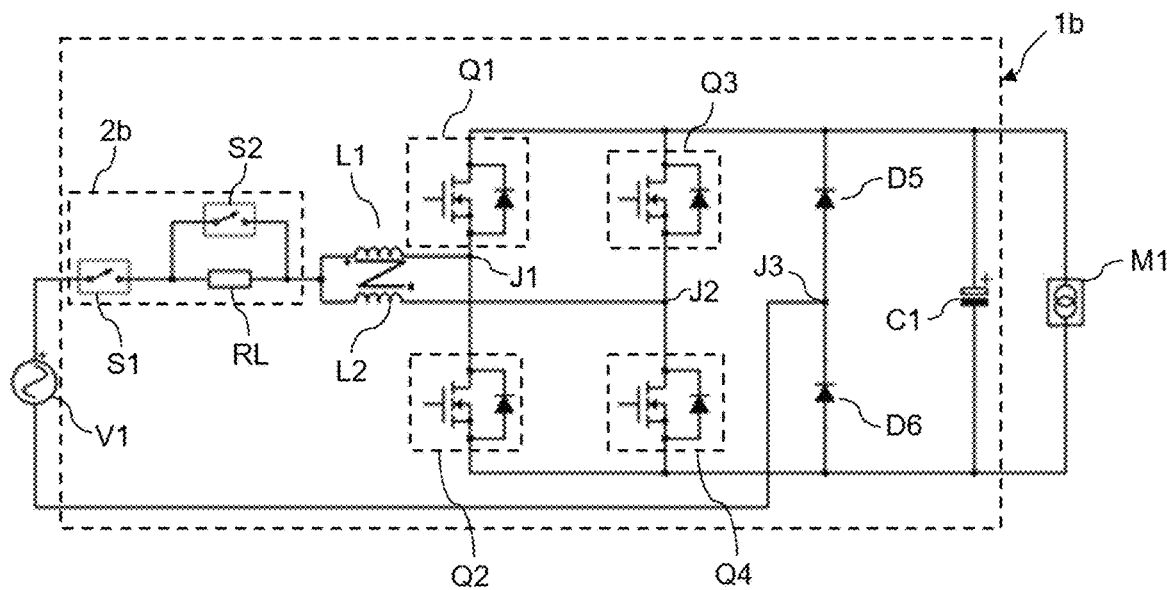
FIG. 2 illustrates another conventional configuration of a switching circuit comprised in a converter.
Figure 3:
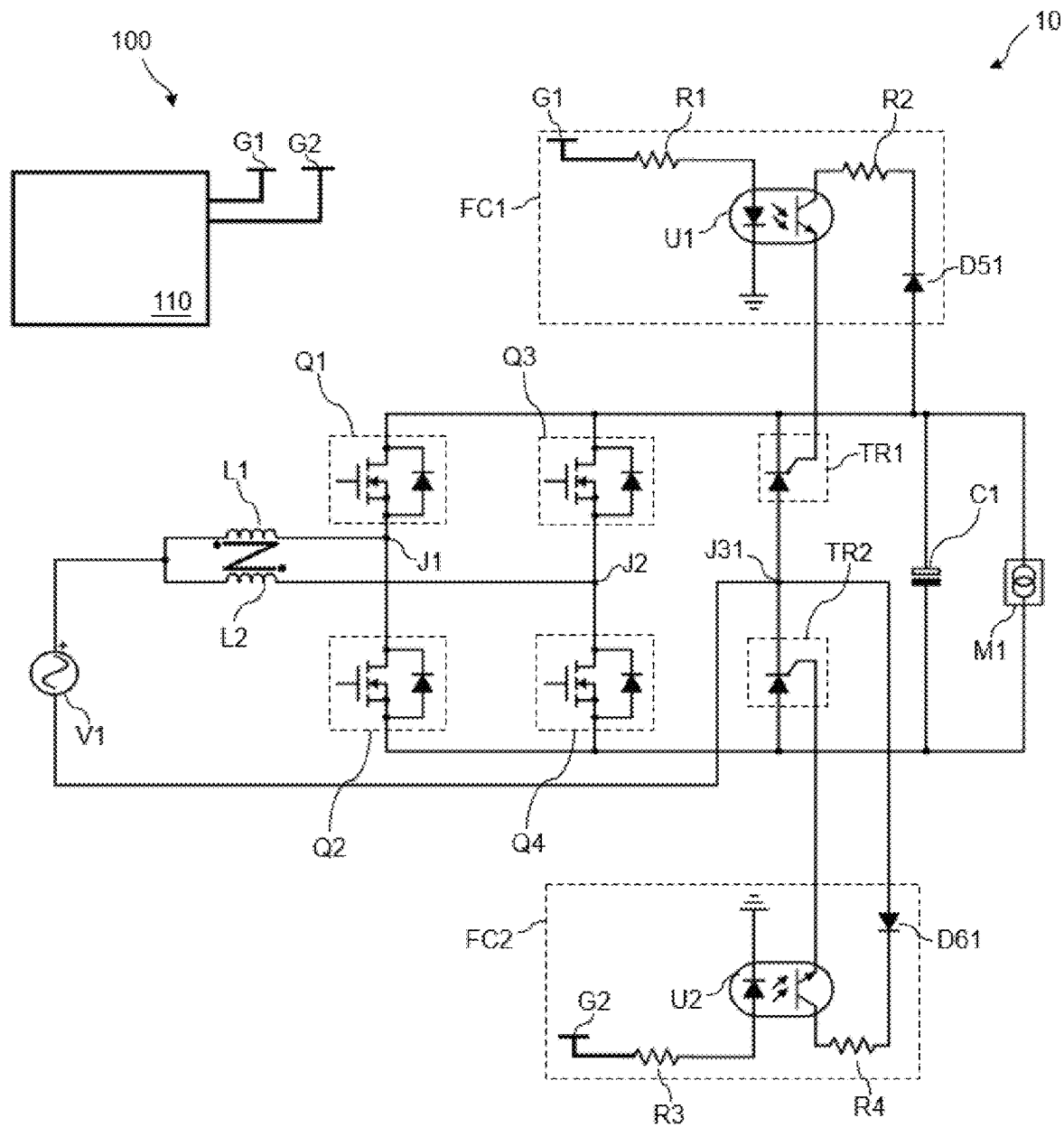
FIG. 3 illustrates a converter comprising a control system according to an embodiment of the invention.

FIG. 3 illustrates a converter 10 comprising a control system 100 according to an embodiment of the invention. The control system 100 comprises a control unit 110, a first starting circuit FC1 and a second starting circuit FC2. The control system 100 is configured to control a current between an alternating voltage source V1 and the converter 10, either during a pre-charging phase during which a capacitor C1 of the converter 10 is charged, or during an operating phase during which an energy consuming element M1 consumes electrical energy supplied by the alternating voltage source V1 through the converter 10. The above electronic components of the control system 100 will be described in greater detail in the following paragraphs. In addition, it is noted that the elements of the converter 10 referenced by the aforementioned references are similar to those of the converter 1a and 1b illustrated in FIGS. 1 and 2.

The converter 10 comprises a power factor correction (PFC) circuit. The PFC circuit of the converter 10 comprises at least a switch, a transformer and a capacitor C1, which are preferably conventional electronic components of an interleaved totem pole bridgeless PFC circuit or alternatively, of a standard PFC circuit. The capacitor C1 is preferably a DC-link capacitor. Other types of capacitors similar or equivalent to the DC-link type capacitor may be used.

In the present embodiment, the PFC circuit comprises four switches Q1 to Q4 which are preferentially metal oxide semiconductor field effect transistors (MOSFETs) or isolated gate bipolar transistors (IGBTs). Preferably, the switches Q1 and Q2 are connected in series and then form a first arm. The switches Q3 and Q4 are connected in series and form a second arm. The first and the second arms are connected in parallel.

The transformer comprises at least two inductances. In the present embodiment, the transformer comprises a first inductance L1 and a second inductance L2. The first inductance L1 is connected to the alternating voltage source V1 and to a node J1 corresponding to a mid-point of the first arm, between the switches Q1 and Q2. The second inductance L2 is connected to a node J2 corresponding to a mid-point of the second arm, between the switches Q3 and Q4, and to the alternating voltage source V1. The invention is not however limited to the number of switches or to the number of inductances comprised in the PFC circuit of the converter 10.

However, instead of comprising the diodes of the conventional PFC circuit (e.g. the diodes D5 and D6 of the converter 1a or 1b) which cannot control the current, the PFC circuit of the converter 10 comprises a plurality of thyristors comprising a first thyristor TR1 and a second thyristor TR2 which are connected in series. The first thyristor TR1 and the second thyristor TR2 are respectively connected to the first starting circuit FC1 and to the second starting circuit FC2, so as to not only form rectifiers which make it possible to transform the alternating current generated by the alternating voltage source V1 into unidirectional current, but also to control, in cooperation with the control unit 110, the unidirectional conduction current. In addition, a node J31 corresponding to a connection point between the first thyristor TR1 and the second thyristor TR2, is connected both to a negative terminal of the alternating voltage source V1 and to the second starting circuit FC2.

Said first arm, said second arm, a third arm comprising said thyristors TR1 and TR2, the capacitor C1, and the energy consuming element M1 are connected between two nodes.

The thyristors TR1 and TR2 are configured to be controlled by a control signal generated as a function of a state of charge of the capacitor C1. In a preferential manner, the control signal comprises a first gate signal G1 and a second gate signal G2, respectively configured to control the first thyristor TR1 and the second thyristor TR2.

The first starting circuit FC1 is connected to the control unit 110. The first starting circuit FC1, comprising a first signal adaptation component U1, at least a resistor and a first diode D51, is configured to control the first thyristor TR1 as a function of a control signal coming from the control unit 110.

In an embodiment, the first starting circuit FC1 comprises a first resistor R1 and a second resistor R2. The first signal adaptation component U1 is connected to earth and to the first resistor R1 which is connected to the control unit 110. The first signal adaptation component U1 is also connected to the first thyristor TR1 of the PFC circuit and to the second resistor R2 which is connected to the first diode D51. The first diode D51 is connected to a node corresponding to a connection point between the first thyristor TR1 and the capacitor C1. In a preferential embodiment, the first starting circuit FC1 comprises galvanic isolation. Advantageously, the first signal adaptation component U1 makes it possible to transmit a signal through this galvanic isolation. The first signal adaptation component U1 is for example an optocoupler, or a digital isolator without or with a push-pull type transistor.

The control unit 110 is also connected to the second starting circuit FC2. In terms of circuit topology, the second starting circuit FC2 is similar to the first starting circuit FC1.

The second starting circuit FC2 comprises a second signal adaptation component U2, at least a resistor, and a second diode D61, and it is configured to control the second thyristor TR2 of the PFC circuit as a function of the control signal coming from the control unit 110.

In an embodiment, the second starting circuit FC2 comprises a third resistor R3 and a fourth resistor R4. The second signal adaptation component U2 is connected to earth and to the third resistor R3 which is connected to the control unit 110 by G3. The second signal adaptation component U2 is also connected to the second thyristor TR2 and to the fourth resistor R4 which is connected to the second diode D61. The second diode D61 is connected to said node J31 between said thyristors TR1 and TR2. In a preferential embodiment, the second starting circuit FC2 comprises galvanic isolation. Advantageously, the second signal adaptation component U2 makes it possible to transmit a signal through this galvanic isolation. The second signal adaptation component U2 is for example an optocoupler, or a digital isolator without or with a push-pull type transistor.

Figure 4:
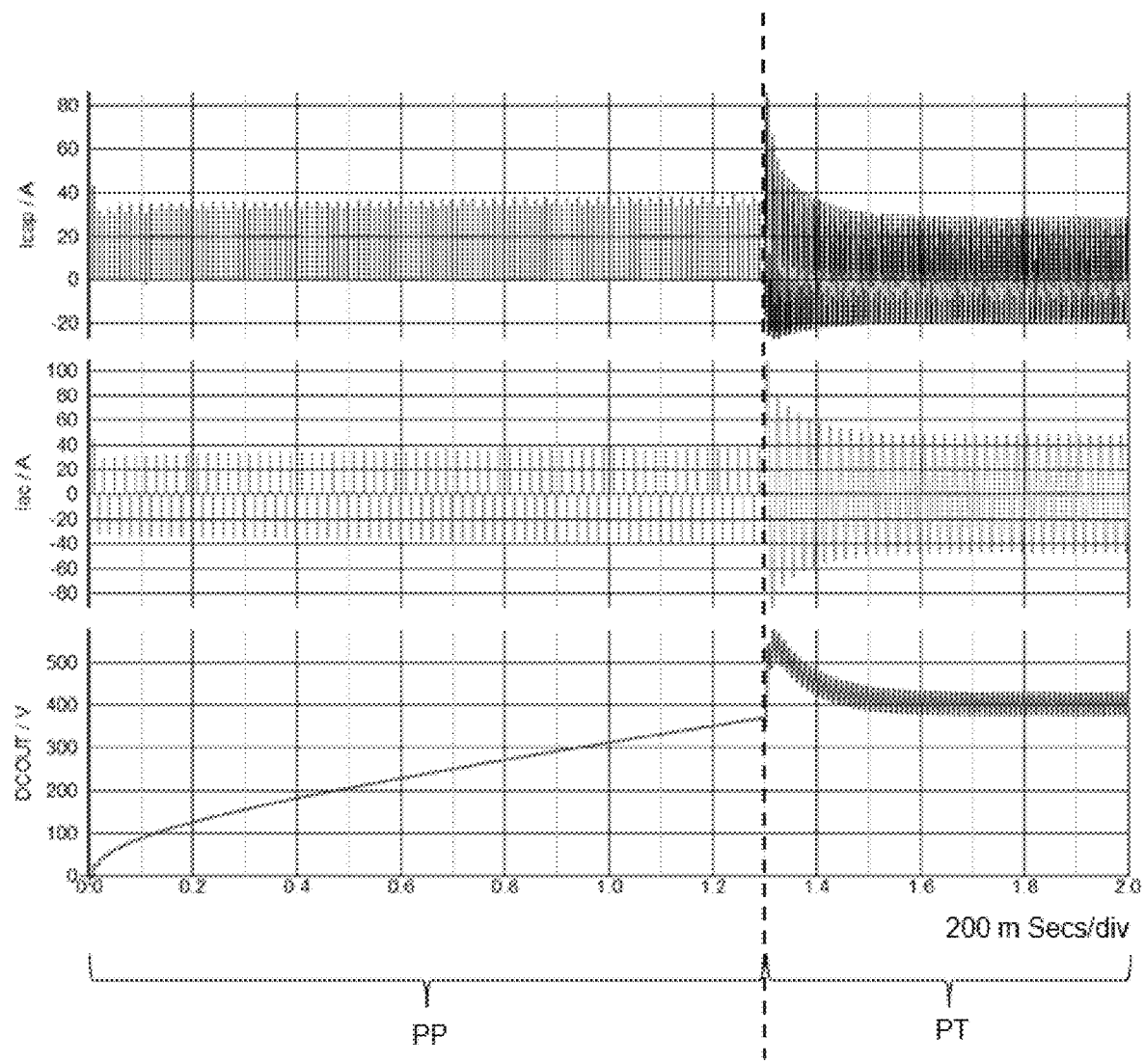
FIG. 4 is a diagram of intensities of currents and voltages measured at different moments when the converter is in the pre-charging phase and in that of energy transfer, according to an embodiment of the invention.

The converter 10 may be either in the pre-charging phase or in the operating phase, as described in FIG. 4. FIG. 4 is a diagram of intensities of currents "Icap", "Iac" and voltages "DCOUT" measured at different moments when the converter 10 is in the pre-charging phase (i.e. referenced by "PP" in FIG. 4) and in that of energy transfer (i.e. referenced by "PT"), according to an embodiment of the invention. The terms "Icap", "Iac" and "DCOUT" signify respectively the current passing in the capacitor C1, the input current generated by the alternating voltage source V1, and the voltage at the terminals of the capacitor C1.

As mentioned previously, before switching to the operating phase, the capacitor C1 must imperatively and beforehand be sufficiently charged so as to avoid inrush currents during the operating phase of the converter 10.

The control unit 110 is then configured to detect the state of charge of the capacitor C1, at least as a function of the voltage at the terminals of the capacitor C1. The control unit 110 is next configured to generate the control signal as a function of the state of charge of the capacitor C1.

Advantageously, the state of charge of the capacitor C1 is determined by a comparison between the voltage at the terminals of the capacitor C1 and a predefined energy threshold. If the voltage at the terminals of the capacitor C1 is below the predefined energy threshold, the capacitor C1 is considered as insufficiently charged. Thus, the state of charge of the capacitor C1 implies that the converter 10 must enter into the pre-charging phase, as described in the example of FIG. 4. According to this example of FIG. 4, at the end of 1.3 seconds after the start of the operating phase PT, the converter 10 enters into a pre-charging phase PP.

During the pre-charging phase, the control unit 110 determines, as a function of the voltage at the terminals of the capacitor C1, a desired pre-charging duration at the end of which the capacitor C1 is considered as sufficiently charged. To this end, the control unit 110 is configured to generate, as mentioned above, the control signal comprising gate pulses intended for said thyristors TR1 and TR2 and applied for variable pulse durations determined at least as a function of the voltage at the terminals of the capacitor C1 and/or the desired pre-charging duration.

The first and the second starting circuits FC1 and FC2 thus control respectively, as a function of the control signal generated by the control unit 110, the first thyristor TR1 and the second thyristor TR2. At the pre-charging phase, the gate pulses are applied to the two thyristors TR1 and TR2 as a function of said control signal, in such a way that said two thyristors TR1 and TR2 are alternately placed in the conducting state to enable the pre-charging of the capacitor C1 before supplying the energy consuming element M1. In this way, a control of the firing angle of the first thyristor TR1 and that of the firing angle of the second thyristor TR2 may be carried out.

The gate pulses applied to said thyristors TR1 and TR2 may be delayed for a certain time as a function of the control signal. The conduction is thus controlled in such a way as to carry out the charging of the capacitor C1 during said desired pre-charging duration.

If the electrical energy stored in the capacitor C1 is equal to or above the predefined energy threshold, the capacitor C1 is considered as sufficiently charged. The state of charge of the capacitor C1 thus implies that the converter 10 may be in the operating phase and thus be able to supply the energy consuming element M1.

Figure 5:
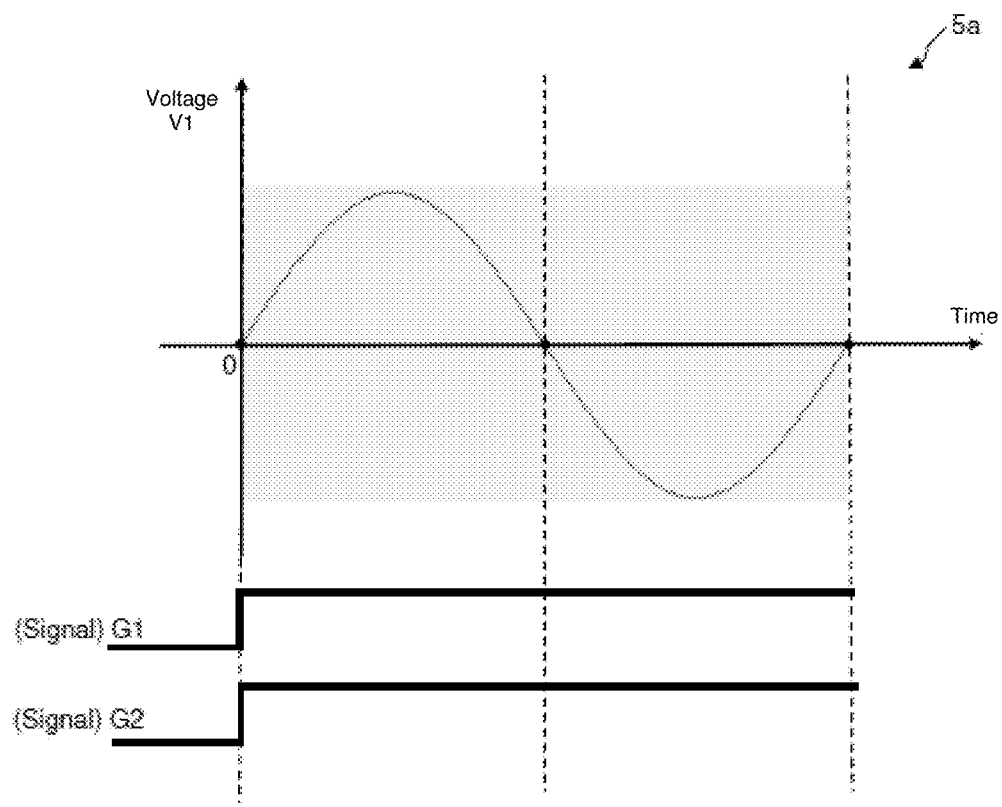
FIG. 5 illustrates two ways according to the invention carried out to control, in operating phase, said thyristors.
Figure 5:
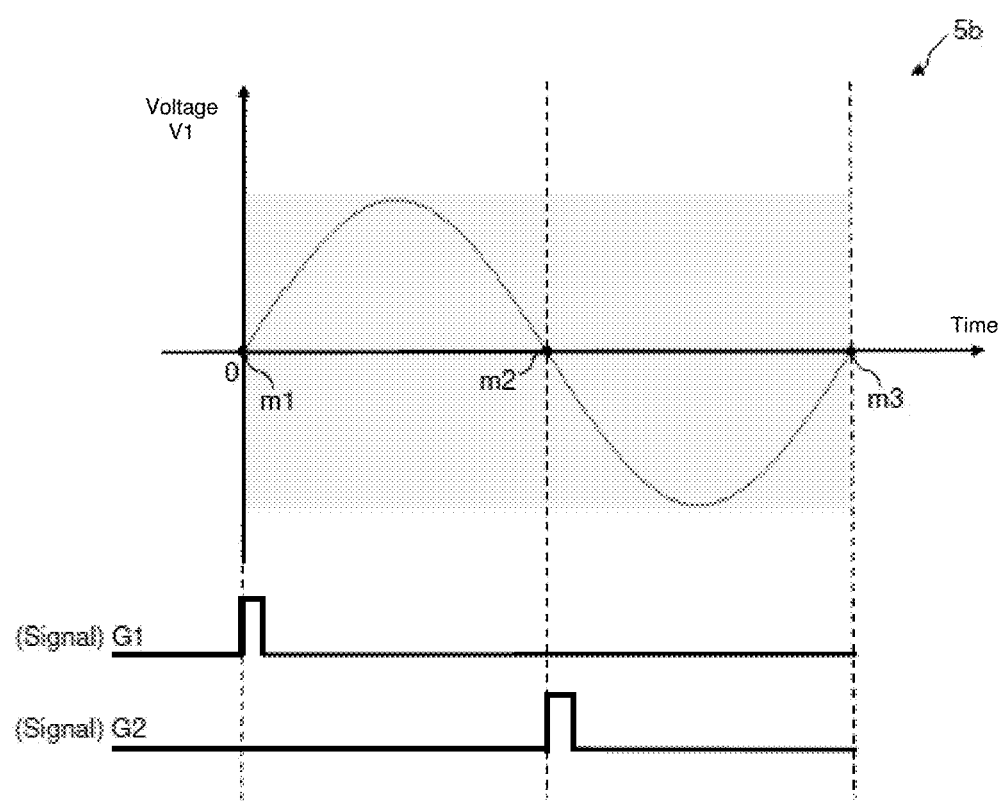

During the operating phase, said thyristors TR1 and TR2 operate as diodes. FIG. 5 illustrates two ways (referenced respectively "5a" and "5b") carried out to control, in operating phase, said thyristors TR1 and TR2. In an embodiment illustrated by example 5a in FIG. 5, the gate signals G1 and G2 of the control signal are each at a high level continually during the operating phase. Thus, said thyristors TR1 and TR2 are always controlled.

In another embodiment illustrated for example by 5b in FIG. 5, at each zero crossing of the supply voltage supplied by the alternating voltage source V1 (e.g. at the moments m1, m2 and m3 of example 5b), only one of the gate signals G1 and G2 is active. The gate signals G1 and G2 each comprise a gate pulse at a high level and are such that said thyristors TR1 and TR2 are alternately controlled on detection of zero crossing, corresponding to a rising edge or a falling edge, according to whether it involves the first thyristor TR1 or the second thyristor TR2. In other words, a single thyristor receives a control as a function of the alternation of the alternating supply voltage supplied by the alternating voltage source V1. For a passage from a negative voltage to a positive voltage, it is the first thyristor TR1 which is fired. For a passage from a positive voltage to a negative voltage, it is the second thyristor TR2 which is fired. Thus, each thyristor TR1, TR2 is fired at the zero crossing of the supply voltage supplied by the alternating voltage source V1 by the gate signal which is dedicated thereto (i.e. G1 for TR1 and G2 for TR2). Each thyristor TR1, TR2 switches off automatically when the difference in voltage between its anode and its cathode becomes negative. That is to say when the supply voltage supplied by the alternating voltage source V1 switches from positive alternation to negative alternation for the first thyristor TR1; and similarly when the supply voltage supplied by the alternating voltage source V1 switches from negative alternation to positive alternation for the second thyristor TR2.

The invention uses the control unit 110, instead of using a typical switching circuit (i.e. the switching circuits 2a and 2b described in FIG. 1 or 2), to determine at a given instant when the converter 10 must be in the pre-charging phase or not, which makes it possible to carry out pre-charging of the capacitor C1 automatically without needing to use the typical switching circuit. Thus, compared to typical control circuits, the control system 100 is more efficient and has the following advantages: reducing the size and the manufacturing cost of the converter 10, simplifying the manufacture of the converter 10 and improving the reliability of the converter 10.

The invention is not limited to the embodiments described previously but extend to any embodiment in line with its spirit.

The invention claimed is:

1. A converter, configured to supply an energy consuming element during an operating phase, said converter comprising a PFC (power correction factor) circuit comprising a capacitor, said converter being configured to charge said capacitor during a pre-charging phase prior to the operating phase, said converter comprising a control system configured to control said pre-charging phase; the converter being characterised in that:

said PFC circuit comprises thyristors; and said control system comprises a control unit configured to, during said pre-charging phase, detect the state of charge of the capacitor, and to generate a control signal configured to control said thyristors as a function of the state of charge of the capacitor, said control system further comprises starting circuits, respectively dedicated to one of said thyristors and respectively configured to control, as a function of said control signal, the thyristor to which the starting circuit is dedicated, and said starting circuits each comprise at least a resistor and a diode, and wherein the diode of one of said starting circuits is connected to a node corresponding to a connection point between the capacitor and the thyristor to which the starting circuit is dedicated; the diode of the other of said starting circuits being connected to a node corresponding to a connection point between the thyristors connected in series.

2. The converter according to claim 1, wherein the control unit is configured such that the control signal comprises gate pulses to be applied to said thyristors in such a way that the two thyristors are alternately placed in the conducting state to enable pre-charging of the capacitor.

3. The converter according to claim 1, wherein the PFC circuit is configured such that, in operating phase, said thyristors operate as diodes.

4. The converter according to claim 3, wherein the control unit is configured to, in operating phase, generate a control signal comprising a first gate signal and a second gate signal respectively configured to control the first thyristor and the second thyristor, the two gate signals each being at a high level.

5. The converter according to claim 3, wherein the control unit is configured to, in operating phase:

generate a control signal comprising a first gate signal and a second gate signal respectively configured to control the first thyristor and the second thyristor, and at each zero crossing of a supply voltage, that only one of the gate signals comprises a pulse at a high level, such that said thyristors are alternately controlled on detection of zero crossing.

6. The converter according to claim 1, wherein said starting circuits each comprise a signal adaptation component configured to control through galvanic isolation.

7. The converter according to claim 1, wherein said PFC circuit comprises two switches connected in series to form a first arm, and two switches connected in series to form a second arm, wherein said thyristors are connected in series to form a third arm; and wherein said first arm, said second arm, said third arm, the capacitor, and the energy consuming element are connected in parallel between two same nodes.

8. The converter according to claim 1, wherein the PFC circuit is an interleaved totem pole bridgeless PFC circuit; the capacitor being a DC-link capacitor.

* * * * *